United States Patent
Noy et al.

(10) Patent No.: US 12,337,608 B2
(45) Date of Patent: Jun. 24, 2025

(54) DYNAMIC PATTERN TRANSFER PRINTING AND PATTERN TRANSFER SHEETS WITH SPACED GROUPS OF TRENCHES

(71) Applicant: Wuhan Dr Laser Technology Corp., Ltd., Wuhan (CN)

(72) Inventors: Amir Noy, Kfar Mordechai (IL); Gad Igra, Ness Ziona (IL); Oren Stern, Netiv HaAsara (IL); Eran Yunger, Moshav Sdei Avraham (IL); Moshe Finarov, Reshovot (IL)

(73) Assignee: Wuhan DR Laser Technology Corp., LTD, Wuhan (CN)

( * ) Notice: Subject to any disclaimer, the term of this patent is extended or adjusted under 35 U.S.C. 154(b) by 386 days.

(21) Appl. No.: 17/940,039

(22) Filed: Sep. 8, 2022

(65) Prior Publication Data

US 2023/0071007 A1    Mar. 9, 2023

(30) Foreign Application Priority Data

Sep. 8, 2021   (CN) .......................... 202111053056.X
Sep. 8, 2021   (CN) .......................... 202122167282.2

(51) Int. Cl.
*B41M 5/025*   (2006.01)
*B41J 2/44*    (2006.01)
(Continued)

(52) U.S. Cl.
CPC ............ *B41M 5/0256* (2013.01); *B41J 2/442* (2013.01); *C23C 14/048* (2013.01); *H10F 71/00* (2025.01);
(Continued)

(58) Field of Classification Search
CPC ........ B41M 5/0256; B41M 5/24; B41J 2/442; B41J 29/393; C23C 14/048; C23C 14/28;
(Continued)

(56) References Cited

U.S. PATENT DOCUMENTS 9,616,524 B2   4/2017   Matusovsky et al.
10,973,129 B2  4/2021   Landa et al.
(Continued)

FOREIGN PATENT DOCUMENTS

CN   104647885 A   5/2015
CN   112420567 A   2/2021
(Continued)

OTHER PUBLICATIONS

Search Report dated Jan. 31, 2023 for European Patent Application No. EP22194445.7.
Luque and Hegedus (eds.) 2011, Handbook of photovoltaic science and engineering, pp. 276-277, 282-283, John Wiley & Sons Ltd.

*Primary Examiner* — Henok D Legesse
(74) *Attorney, Agent, or Firm* — PEARL COHEN ZEDEK LATZER BARATZ LLP

(57) ABSTRACT

Dynamic pattern transfer printing systems and method are provided, which decouple the design of the trench patterns on a source substrate for pattern transfer printing, from the resulting metallic paste lines patterns transferred to a receiving substrate, such as PV cells. The receiving substrate may be moved forward (along the scanning direction of the laser illumination used to transfer the paste from the trenches onto the receiving substrate) to reduce the pattern pitch with respect to the source substrate, and/or the receiving substrate may be moved backward (against the scanning direction) to increase the pattern pitch with respect to the source substrate. For example, dynamic pattern transfer printing may be used to accommodate different widths of the substrates for more effective pattern transfer, and/or to enable one-to-many pattern transfer technologies with high wafer throughput. Also, pattern transfer sheet with separate multiple groups of trenches are provided.

11 Claims, 5 Drawing Sheets

(51) Int. Cl.
*C23C 14/04* (2006.01)
*H10F 71/00* (2025.01)
*B41J 29/393* (2006.01)
*B41M 5/24* (2006.01)
*C23C 14/28* (2006.01)
*H05K 1/09* (2006.01)
*H05K 3/20* (2006.01)
*H10F 77/20* (2025.01)

(52) U.S. Cl.
CPC ............... *B41J 29/393* (2013.01); *B41M 5/24* (2013.01); *C23C 14/28* (2013.01); *H05K 1/092* (2013.01); *H05K 3/207* (2013.01); *H05K 2201/0154* (2013.01); *H05K 2203/0113* (2013.01); *H10F 77/211* (2025.01)

(58) Field of Classification Search
CPC ....... H10F 71/00; H10F 77/211; H05K 1/092; H05K 3/207; H05K 2201/0154; H05K 2203/0113
See application file for complete search history.

(56) References Cited

U.S. PATENT DOCUMENTS

| | | |
|---|---|---|
| 2003/0022403 A1 | 1/2003 | Shimoda et al. |
| 2005/0054121 A1 | 3/2005 | Handy et al. |
| 2011/0097550 A1* | 4/2011 | Matusovsky ...... B23K 26/0006 |
| | | 428/167 |
| 2019/0334056 A1 | 10/2019 | Schlemper et al. |
| 2021/0136923 A1 | 5/2021 | Landa |
| 2021/0385951 A1* | 12/2021 | Zenou ................. H05K 3/0091 |

FOREIGN PATENT DOCUMENTS

| | | |
|---|---|---|
| CN | 217073715 U | 7/2022 |
| EP | 2294240 | 3/2011 |
| KR | 20050003235 A | 1/2005 |
| WO | WO 2018/020479 | 2/2018 |
| WO | WO-2018/020481 A1 | 2/2018 |
| WO | WO-2018/020483 A1 | 2/2018 |

* cited by examiner

DYNAMIC PATTERN TRANSFER PRINTING AND PATTERN TRANSFER SHEETS WITH SPACED GROUPS OF TRENCHES

CROSS-REFERENCE TO RELATED APPLICATIONS

This application is claiming priority from Chinese Application Number 202111053056.X filed on Sep. 8, 2021, and Chinese Utility Model Application Number 202122167282.2 filed on Sep. 8, 2021, which are hereby incorporated by reference.

BACKGROUND OF THE INVENTION

1. Technical Field

The present invention relates to the field of pattern transfer printing (PTP), and more particularly, to non-contact pattern transfer printing of high viscosity paste.

2. Discussion of Related Art

The mostly used method of printing high viscosity paste in solar PV and electronics industries is a screen printing. In this method the mesh screen contacts the receiving substrate, the paste is pushed through openings in the screen and the printed pattern copies the pattern of the screen. The receiving substrate and the screen are stationary during printing so the deposited paste pattern cannot be changed during printing (see for example Luque and Hegedus (eds.) 2011, Handbook of photovoltaic science and engineering, pages 276-277).

U.S. Pat. No. 9,616,524, which is incorporated herein by reference in its entirety, teaches a method of depositing a material on a receiving substrate, the method comprising: providing a source substrate having a back surface and a front surface, the back surface carrying at least one piece of coating material; providing a receiving substrate positioned adjacent to the source substrate and facing the coating material; and radiating light towards the front surface of the source substrate, to remove at least one piece of the coating material from the source substrate and deposit said removed at least one piece onto the receiving substrate as a whole. In this method source substrate, which defines the pattern to be deposited, does not contact the receiving substrate. The source and receiving substrates are stationary during printing therefore the deposited paste pattern copies the pattern of the source substrate and cannot be changed during printing.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a dynamic pattern transfer printing system comprising: at least one laser scanner configured to illuminate with at least one laser beam a source substrate that comprises a plurality of trenches arranged in a first pattern and holding printing paste, wherein the source substrate is configured to release the printing paste from the trenches and onto a receiving substrate upon the illumination by the laser beam, a moveable stage supporting the receiving substrate, wherein the receiving substrate is affixed to the moveable stage during the releasing of the printing paste from the source substrate, and a controller configured to control the laser beam illumination along the trenches, and at a scanning direction across the trenches, and further configured to move the moveable stage to yield a second pattern of deposited paste on the receiving substrate, which is different from the first pattern of trenches on the source substrate.

One aspect of the present invention provides a dynamic pattern transfer printing method comprising: illuminating a source substrate with at least one laser beam, wherein: the source substrate comprises a plurality of trenches arranged in a first pattern and holding printing paste, the source substrate is configured to release the printing paste from the trenches and onto a receiving substrate upon the illumination by the laser beam, and the illuminating is carried out along the trenches, and at a scanning direction across the trenches; and controllably moving the receiving substrate to yield a second pattern of deposited paste on the receiving substrate, which is different from the first pattern of trenches on the source substrate.

One aspect of the present invention provides a pattern transfer sheet comprising: a plurality of groups of trenches and configured to receive printing paste and release the printing paste from the trenches upon illumination by a laser beam onto a receiving substrate, wherein a pitch of the trenches in each group is constant and the groups are separated by gaps.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

Figure 1A:
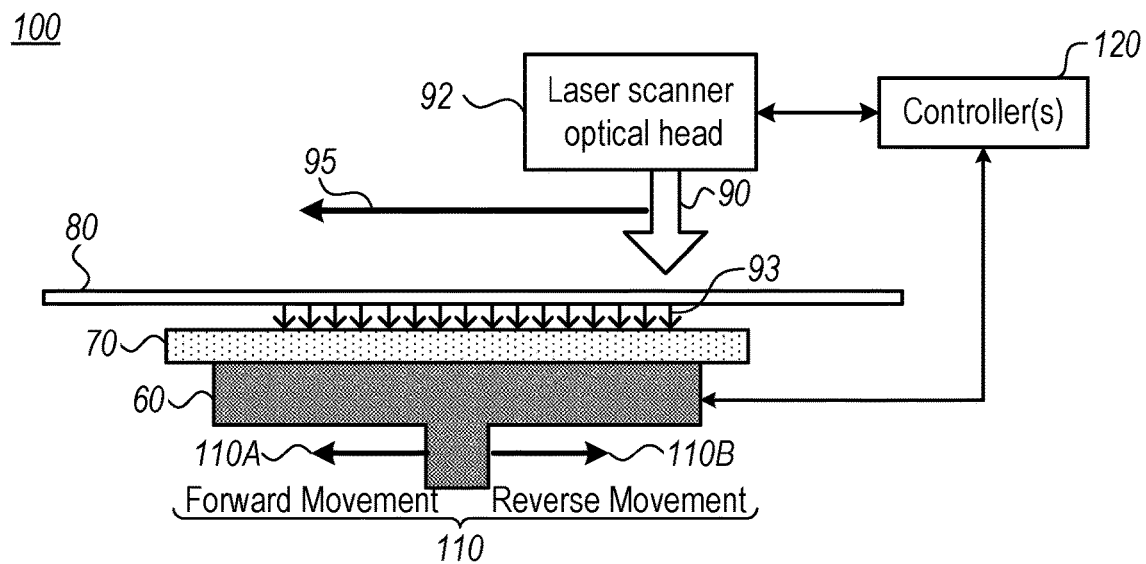
FIGS. 1A and 1B are high-level schematic illustrations of dynamic pattern transfer printing systems, according to some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "controlling", "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for improving pattern transfer printing (PTP) and thereby provide improvements to the technological field of wafer production. Dynamic pattern transfer printing systems and methods are provided, which decouple the design of the trench patterns on a source substrate for pattern transfer printing, from the resulting metallic paste lines patterns transferred to a receiving substrate, such as PV cells. In various embodiments, disclosed PTP systems and methods may be configured to print fine lines of thick metallic paste to produce electronic circuits, e.g., to create conductive lines or pads or other features on laminates for PCBs (printed circuit boards) or other printed electronic boards. Other applications may comprise creating conductive features in the manufacturing processes of mobile phones antennas, decorative and functional automotive glasses, semiconductor integrated circuits (IC), semiconductor IC packaging connections, PCB features and components assemblies, optical, biological, chemical and/or environment sensors and detectors, radio frequency identification (RFID) antennas, organic light-emitting diode (OLED) displays (passive or active matrix), OLED illuminations sheets, printed batteries and other applications—any of which may comprise the receiving substrate. The receiving substrate may be moved forward (along the scanning direction of the laser illumination used to transfer the paste from the trenches onto the receiving substrate) to reduce the pattern pitch with respect to the source substrate, and/or the receiving substrate may be moved backward (against the scanning direction) to increase the pattern pitch with respect to the source substrate. For example, dynamic pattern transfer printing may be used to accommodate different widths of the substrates for the same width of the source substrate, and/or to enable one-to-many pattern transfer technologies with high wafer printing throughput. Also, pattern transfer sheet with separate multiple groups of trenches are provided, such as pattern transfer sheets having multiple groups of trenches, which are configured to receive printing paste and release the printing paste from the trenches upon illumination by a laser beam onto a receiving substrate, wherein a pitch of the trenches in each group is constant and the groups are separated by gaps.

In several industrial applications there is a need to adapt the existing pattern of the source substrate according to changing target locations of printed lines on the receiving substrate and to increase the throughput of the pattern transfer system. The relative movement of the receiving substrate vs. stationary source substrate during printing, which is possible only by using a non-contact printing method like the PTP, provides pattern transfer flexibility that enables adapting the existing pattern of the source substrate according to changing target locations of printed lines on the receiving substrate. Moreover, disclosed pattern transfer sheets enable pattern transfer printing in a one-to-many mode, from one source substrate onto multiple wafer—to increase the throughput of the pattern transfer system.

Figure 1B:
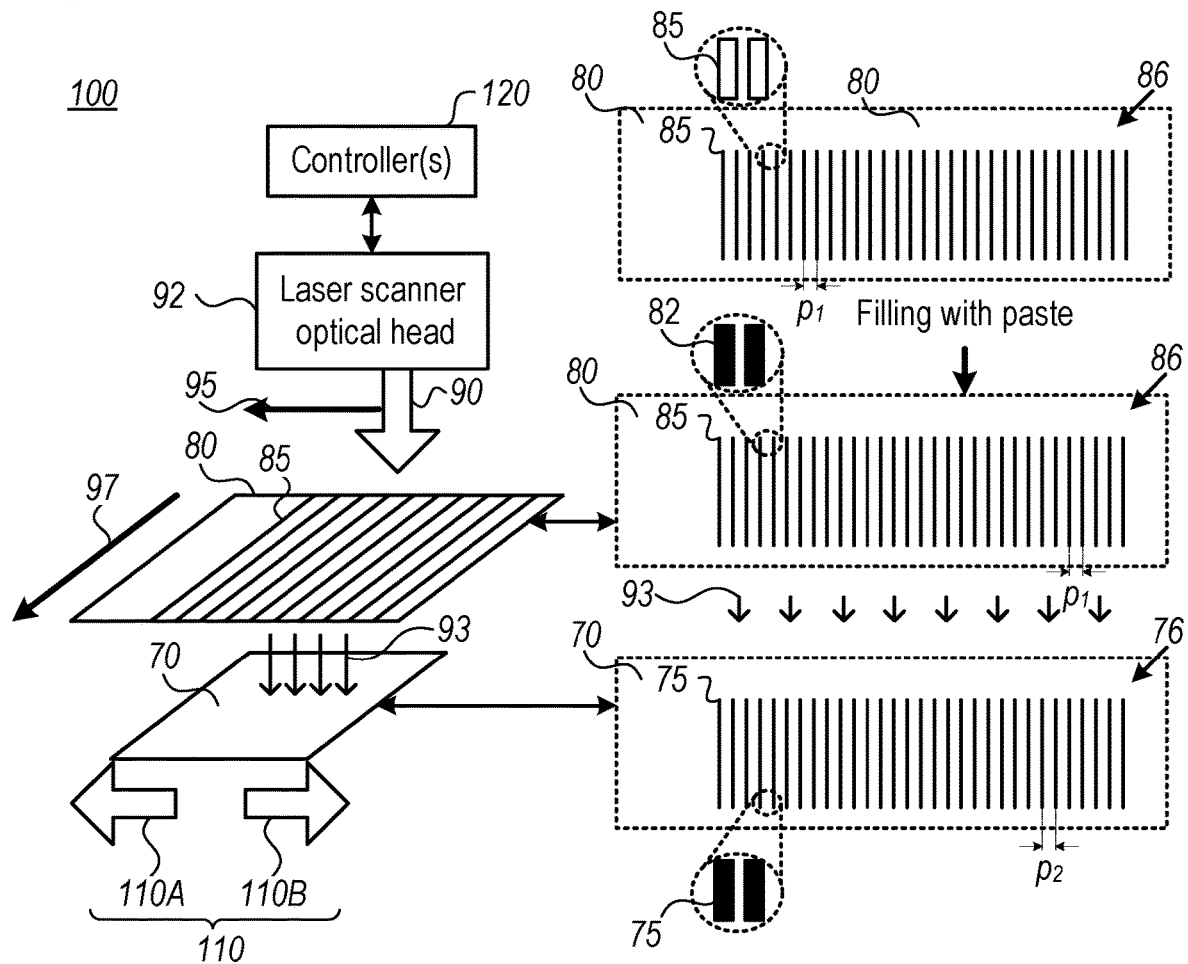

FIGS. 1A and 1B are high-level schematic illustrations of a dynamic pattern transfer printing system 100, according to some embodiments of the invention.

Dynamic pattern transfer printing system 100 comprises at least one laser scanner optical head(s) 92 configured to illuminate with at least one laser beam 90 a source substrate 80 that comprises a plurality of trenches 85 arranged in a first pattern 86 and holding printing paste 82. Source substrate 80 is configured to release printing paste 82 from trenches 85 onto a receiving substrate 70 (indicated schematically as pattern transfer 93) upon the illumination by laser beam 90 (see e.g., FIG. 1B). Laser scanner optical head(s) 92 may configured to have a fast-scanning axis along a machine direction 97 (MD) and may be moved along a cross machine direction 97 (CMD).

Figure 5A:
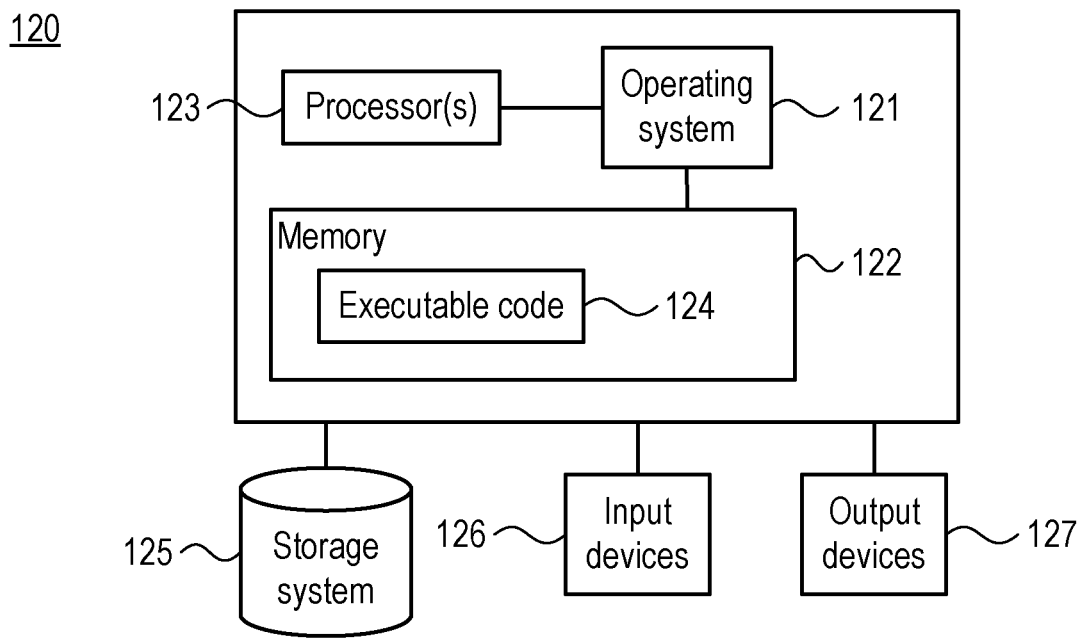
FIG. 5A is a high-level block diagram of exemplary controllers, which may be used with embodiments of the present invention.
Figure 5B:
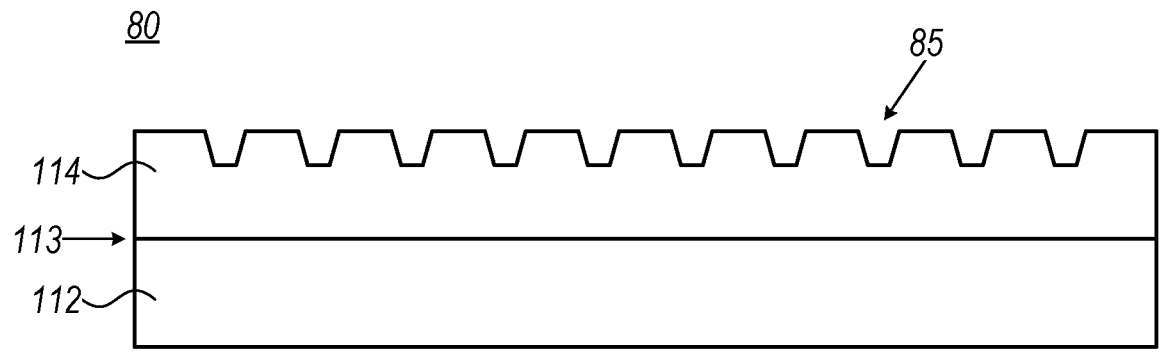
FIG. 5B is a high-level schematic cross section illustration of a pattern transfer sheet, according to some embodiments of the invention.

For example, as illustrated schematically in FIG. 5B, source substrate 80 may comprise a pattern transfer sheet, made e.g., of transparent polymer material, with trenches 85 having any of various profiles (cross section shapes), such as trapezoid, rounded, square, rectangular and/or triangular profiles. The polymer material and trench profile may be configured to release paste 82 that is filled into them—upon the illumination by laser beam 90. In certain embodiments, trenches 85 may be embossed, press molded, pneumatically molded, or laser molded onto source substrate 80 during a production process. Trenches 85 may be filled with paste 82 (as for example described in U.S. Pat. No. 9,616,524) within dynamic pattern transfer printing system 100, prior to the illumination. Source substrate 80 may be made of a single layer or of two or more layers attached to each other, e.g., with one layer being embossed or molded, and another layer providing mechanical strength to source substrate 80. For example, source substrate 80 may comprise a top polymer layer 114 and a bottom polymer layer 112. In some embodiments, top polymer layer 114 may be made of semi-crystalline polymer and have a melting temperature below 170° C., e.g., below 150° C., below 130° C., below 110° C. or have intermediate values. In some embodiments, top polymer layer 114 may be made of amorphous polymer and have a glass temperature below 160° C., e.g., below 140° C., below 120° C., below 100° C. or have intermediate values. Bottom polymer layer 112 may have a higher melting temperature than the melting temperature or the glass temperature of top polymer layer 114. For example, bottom polymer layer 112 may have a melting temperature above 150° C., above 160° C. (e.g., bi-axially-oriented polypropylene), above 170° C., and up to 400° C. (e.g., certain polyimides), or have intermediate values.

In various embodiments, polymer layers 112, 114 may be made of at least one of: polyethylene, polypropylene, polyethylene terephthalate, polybutylene terephthalate, polyethylene naphthalate, fully aromatic polyester, other copolymer polyester, polymethyl methacrylate, other copolymer acrylate, polycarbonate, polyamide, polysulfone, polyether sulfone, polyether ketone, polyamideimide, polyether imide, aromatic polyimide, alicyclic polyimide, fluorinated polyimide, cellulose acetate, cellulose nitrate, aromatic polyamide, polyvinyl chloride, polyphenol, polyarylate, polyphenylene sulfide, polyphenylene oxide, polystyrene, or combinations thereof—as long as top polymer layer 114 has a melting or glass transition temperature ($T_m/T_g$) below the melting or glass transition temperature ($T_m/T_g$) of bottom polymer layer 112 and/or as long as bottom polymer layer 112 is not affected by the processing conditions of top polymer layer 114.

In certain embodiments, top and bottom polymer layers 114, 112 (respectively) may be between 10 μm and 100 μm thick, e.g., between 15 μm and 80 μm thick, between 20 μm and 60 μm thick, between 25 μm and 45 μm thick, or have other intermediate values—with bottom polymer layer 112 being preferably at least as thick as top polymer layer 114. The polymer layers may be attached by an adhesive layer 113 that is thinner than 10 μm (e.g., thinner than 8 μm, thinner than 6 μm, thinner than 4 μm, thinner than 2 μm or have intermediate values) and is likewise transparent to the laser illumination. For example, in certain embodiments, top polymer layer 114 may be thicker than the depth of trenches 85 by several μm, e.g., by 5 μm, by 3-7 μm, by 1-9 μm, or by up to 10 μm. For example, trenches 85 may be 20 μm deep, top polymer layer 114 may be 20-30 μm thick and bottom polymer layer 112 may range in thickness between 15 μm and 35 μm (it is noted that thicker bottom polymer layer provide better mechanical performances). It is noted that the term "trenches" is not to be construed as limiting the shape of trenches 85 to linear elements, but is understood in a broad sense to include any shape of trenches 85.

The temperature and thickness of top and bottom polymer layers (114, 112 respectively) may be designed so that top polymer layer 114 has good molding, ductility and certain mechanical strength, while bottom polymer layer 112 has good mechanical strength. Both top and bottom polymer layers (114, 112 respectively) may be designed to have good bonding properties.

Receiving substrate 70 may comprise a silicon wafer, as used, e.g., for manufacturing PV cells of different types as described in detail, e.g., in Luque and Hegedus (eds.) 2011, Handbook of photovoltaic science and engineering, pages 276-277, incorporated herein by reference in its entirety. In various embodiments, receiving substrate 70 may comprise any type of electronic circuits, e.g., PCBs or other printed electronic boards, mobile phones antennas, decorative and functional automotive glasses, semiconductor integrated circuits (IC), semiconductor IC packaging connections, optical, biological, chemical and/or environment sensors and detectors, radio frequency identification (RFID) antennas, organic light-emitting diode (OLED) displays (passive or active matrix), OLED illuminations sheets, printed batteries and other applications.

Dynamic pattern transfer printing system 100 further comprises a moveable stage 60 supporting receiving substrate 70, with receiving substrate 70 being affixed (e.g., by help of vacuum clamping) to moveable stage 60 during the releasing of printing paste 82 from source substrate 80 (see e.g., FIG. 1A). Moveable stage 60 may comprise any type of stage or wafer holder that can affix and move receiving substrate 70. Moveable stage 60 may be moved by any type of actuator, e.g., by linear or step motors.

Dynamic pattern transfer printing system 100 further comprises a controller 120 configured to control laser scanner optical head 92 to direct laser beam 90 along trenches 85 (along machine direction 97—MD), and at a scanning direction 95 (CMD—cross machine direction) across trenches 85. Controller 120 is further configured to move moveable stage 60 (the movements are denoted schematically by numeral 110) to yield a second pattern 76 of deposited paste on receiving substrate 70, which is different from first pattern 86 of trenches 85 on source substrate 80. Advantageously, in contrast to current practice which is limited to transferring the same pattern (e.g., of lines) from source substrate 80 to receiving substrate 70, various embodiments of dynamic pattern transfer printing system 100 enable to deposit the transferred metal paste onto receiving substrate 70 at patterns (second pattern 76) which are different from first pattern 86 of trenches 85 on source substrate 80, as explained in further details below.

It is noted that scanning 95 may be carried out in one or two directions, and respective movements 110 of receiving substrate 70 may be adjusted accordingly. In the present disclosure scanning direction 95 is illustrated in one direction, as a non-limiting example.

For example, first pattern 86 of trenches 85 on source substrate 80 may have a first pitch ("$p_1$") and second pattern 76 of deposited paste on receiving substrate 70 may have a second pitch ("$p_2$"), that is smaller or larger than first pitch ("$p_1$"), e.g., $p_1 > p_2$ or $p_1 < p_2$. It is noted that second pattern 76 may differ from first pattern 86 over the whole extent of receiving substrate 70, over part of the extent of receiving substrate 70, or possibly the way second pattern 76 differs from first pattern 86 may vary across the extent of receiving substrate 70, for example, in some area(s) of receiving substrate 70 the difference may comprise $p_1 > p_2$ while in other area(s) of receiving substrate 70 the difference may comprise $p_1 < p_2$.

In certain embodiments, with first pitch $p_1$ being larger than second pitch $p_2$ ($p_1 > p_2$), controller 120 may be configured to move moveable stage 60 along scanning direction 95 (CMD, denoted 110A) at a forward speed set to convert first pitch $p_1$ to second pitch $p_2$. For example, with forward speed 110A denoted as $v_F$ and the time between deposition of consecutive lines denoted as t, $p_2=p_1-v_F \cdot t$. Alternatively or complementarily, denoting the scanner speed 95 across trenches 85 as $v_S=p_1/t$, the approximate relation between the pitches is $p_2=p_1 \cdot (v_S-v_F)/v_S$.

In certain embodiments, with first pitch $p_1$ being smaller than second pitch $p_2$ ($p_1<p_2$), controller 120 may be configured to move moveable stage 60 against (in a contrary direction to) scanning direction 95 (CMD, denoted 110B) at a backward speed set to convert first pitch $p_1$ to second pitch $p_2$. For example, with backward speed 110B denoted as $v_B$ and the time between deposition of consecutive lines denoted as t, $p_2=p_1+v_B \cdot t$. Alternatively or complementarily, denoting the scanner speed 95 across trenches 85 as $v_S=p_1/t$, the approximate relation between the pitches is $p_2=p_1 \cdot (v_S+v_B)/v_S$.

Figure 2:
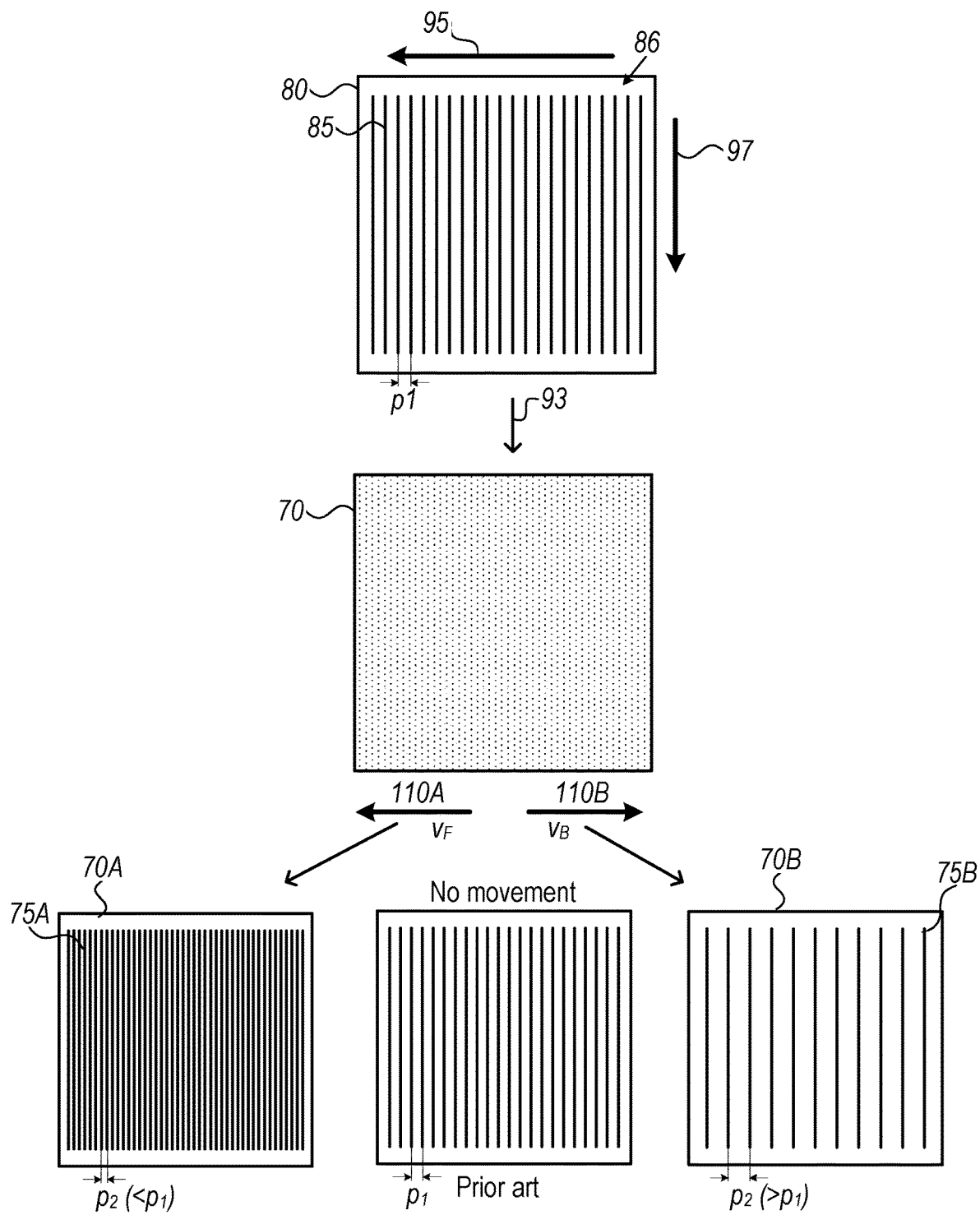
FIG. 2 is a high-level schematic illustration of modifications of the transferred pattern by the dynamic pattern transfer printing systems, according to some embodiments of the invention.

FIG. 2 is a high-level schematic illustration of modifications of the transferred pattern by dynamic pattern transfer printing system 100, according to some embodiments of the invention. FIG. 2 illustrates schematically the modification of the pitch of the stationary trench pattern during printing. Source substrate 80 may comprise a plurality of substantially parallel trenches 85 arranged with a certain source pitch $p_1$. Source substrate 80 may be configured to receive printing paste 82 and release the printing paste from trenches 85 upon illumination by a laser beam 90 onto receiving substrate 70 (see also FIGS. 1A and 1B). Receiving substrate 70 (e.g., a wafer) may comprise a pattern of substantially parallel linear locations arranged with a certain receiving pitch $p_2$, for receiving the paste release from trenches 85 of source substrate 80, in a close proximity to source substrate 80 in such a way that the first trench on source substrate 80 is located exactly opposite to the first linear location on receiving substrate 70. Scanning the paste-filled trench pattern (86) on source substrate 80 by laser beam 90 sequentially from the first trench to the last trench results is deposition of the paste onto the specified locations on receiving substrate 70 to yield deposited paste in the specified pattern (76). As controller 120 moves receiving substrate 70 during the scanning, the paste is deposited at a different pitch ($p_2 \neq p_1$), depending on the direction and speed of motion.

For example, paste deposition on receiving substrate 70 at different pattern 76 than pattern 86 on source substrate 80 may be especially useful in printing conducting lines (fingers) on crystalline silicon PV cells (wafers) that comprise a pattern of narrow selective emitter (SE) lines (see for example in Luque and Hegedus (eds.) 2011, Handbook of photovoltaic science and engineering, pages 282-283, incorporated herein by reference in its entirety). In a non-limiting example, the finger width on receiving substrate 70 may be 30 μm and the required SE line width may be 80 μm—leaving a tolerance for locating the finger within the SE line to be only about ±25 μm (assuming that the SE lines pitch is uniform over the wafer).

In current practice, the pitch of the SE lines may be a little bit different from the pitch of the trenches or be non-uniform over the silicon wafer, so the fingers printed from the stationary source substrate with a constant source pitch do not fall exactly into the pre-defined SE lines. This requires increasing the SE line width that causes PV cell efficiency reduction.

In contrast, in various embodiments, dynamic pattern transfer printing system 100 may be configured to yield wafers 70A, 70B with lines 75A, 75B that are spaced narrower or broader from each other (respectively) according to specified requirements. For example, lines 75A may be narrower spaced than trenches 85 ($p_2<p_1$) by applying forward movement 110A while lines 75B may be wider spaced than trenches 85 ($p_2>p_1$) by applying backward movement 110B. Clearly, line spacing on receiving substrate 70 may be modified to a smaller extent by modifying the speed of either forward or backward movements 110A, 110B respectively, while maintain the direction of movement. Different line spacing may be applied in different regions of wafers 70, e.g., by modifying movement speed 110 and/or by reversing the movement direction if needed.

Advantageously, dynamic pattern transfer printing system 100 enables accurate matching of the positions of the printed fingers to the pattern of SE lines on the silicon wafer during printing, as disclosed herein. For example, by moving and/or by modifying the speed 110 by which controller 120 moves receiving substrate 70, more accurate deposition of paste 82 from tranches 85 onto the predefined locations on receiving substrate 70 may be achieved.

In certain embodiments, different line spacing may be applied in different regions of wafers 70, e.g., by modifying movement speed 110 and/or by reversing the movement direction if needed. For example, a first pattern 86 of trenches 85 on source substrate 80 may have a first uniform pitch $p_1$ and second pattern 76 of deposited paste on receiving substrate 70 may comprise a plurality of linear positions (like SE lines) distributed over the CMD with a variable pitch. Controller 120 may be configured to move moveable stage 60 with a pre-defined variable speed along direction 110A or 110B thus to ensure that all the lines printed from the source substrate 80 are deposited exactly on the specified linear locations on the receiving substrate 70.

Figure 3:
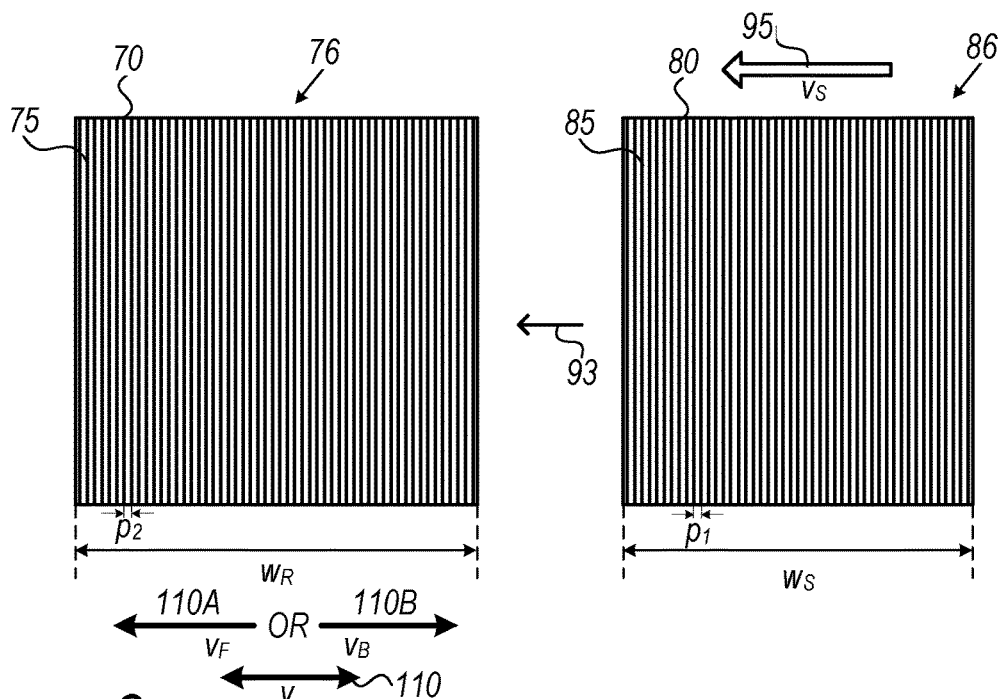
FIG. 3 is a high-level schematic illustration of modifications of the transferred pattern by the dynamic pattern transfer printing systems according to wafer width, according to some embodiments of the invention.

FIG. 3 is a high-level schematic illustration of modifications of the transferred pattern by dynamic pattern transfer printing system 100 according to wafer width, according to some embodiments of the invention. In certain embodiments, controller 120 may be further configured to calculate second pitch $p_2$ with respect to first pitch $p_1$ according to a relation between widths $w_S$ and $w_R$ of source substrate 80 and receiving substrate 70, respectively. Dynamic pattern transfer printing system 100 may be configured to start deposition by aligning source substrate 80 have the first trench located exactly opposite to the pre-defined first finger location on receiving substrate 70 and scanning trench pattern 86 by laser beam 90 sequentially from the first trench to the last trench of pattern 86, while moving receiving substrate 70 during printing in a direction and with a speed required for depositing the paste from trenches 85 onto receiving substrate 70 so that the last printed line is located on the pre-defined distance from the first printed line (which is different from the distance between the first trench to the last trench on source substrate 80).

For example, assuming that the number of trenches 85 is equal to the number of printed lines 75, with stage speed 110 denoted as v (e.g., $v_F$ or $v_B$) and denoting the scanner speed 95 across trenches 85 (CMD) as $v_S$, the width of source substrate 80 as $w_S$ and the width of receiving substrate 70 as $w_R$, may be approximately estimated as $w_R/w_S=(v_S \pm v_{F/B})/v_S$, or $v_{F/B}=\pm v_S \cdot (w_R/w_S-1)$, being positive for $v_F$ (when receiving substrate 70 is narrower than source substrate 80) and negative for $v_S$ (when receiving substrate 70 is wider than source substrate 80).

Advantageously, this mode of operation may be especially useful for printing conducting lines (fingers) on crystalline silicon PV cells (wafers), when the size of the silicon wafer is different from the width of the polymer tape roll that is used as source substrate 80 and is restricted by the tape manufacturing equipment. Dynamic pattern transfer printing system 100 thus enables to print fingers from tape having a certain width onto silicon wafer of different sizes. For example, typical tape width is defined and manufactured for pattern transfer printing on a stationary wafer of $w_S$=156 mm size. The same tape width may be used for PTP on wafers of $w_R$=166 mm size. In this case only length of the trenches is increased, which does not require any change in the equipment for the pattern tape manufacturing. For spreading the printed lines over a wafer of larger width the dynamic printing with 10 mm wafer movement during printing may applied, with a corresponding backward movement 110B of receiving substrate 70 during paste transfer (in this non-limiting example, $v_S$ could be estimated as approximately $10/156$ of $v_S$, the exact value further depending on process details).

Figure 4:
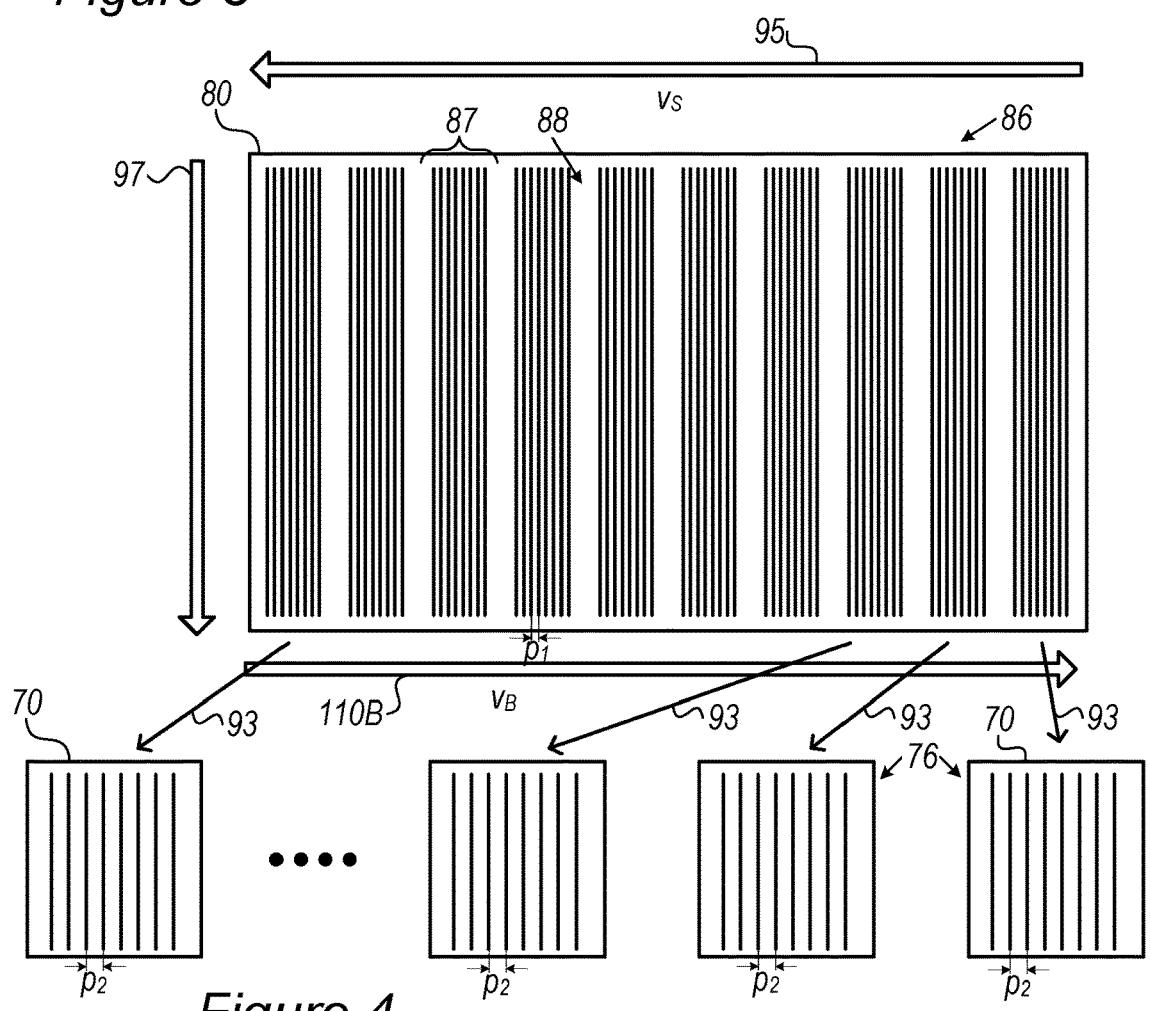
FIG. 4 is a high-level schematic illustration of the source substrate and the stage movements for implementing one-to-many paste deposition, according to some embodiments of the invention.

FIG. 4 is a high-level schematic illustration of source substrate 80 and stage movements 110 for one-to-many paste deposition, according to some embodiments of the invention. Dynamic pattern transfer printing system 100 may be configured to deposit paste 82 from one source substrate 80 onto a plurality of receiving substrates 70, with first pattern 86 of trenches 85 on source substrate 80 comprising a plurality of groups 87 of trenches 85, and controller 120 being further configured to deposit paste 82 from trenches 85 of each group 87 onto one of receiving substrates 70, and to switch receiving substrate 70 between consecutive groups 87 of trenches 85.

Groups 87 may be separated by specified distances d (equal or variable, illustrated schematically as gaps 88), e.g., with each group having trenches 85 arranged at one or more pitches $p_1$ (illustrated in a non-limiting manner as being equal among groups 87, but possibly variable as well). Dynamic pattern transfer printing system 100 and/or controller 120 may be configured to position each consecutive receiving substrate 70 for receiving paste 82 from trenches 85 of respective consecutive groups 87 on source substrate 80 at specified receiving pitch(es) $p_2$ (not shown), in a close proximity to source substrate 80, in such a way that the first trench of each consecutive group 87 is located exactly opposite to the first pre-defined printed line location on respective consecutive receiving substrate 70. While the optical head of laser scanner 92 of dynamic pattern transfer printing system 100 is used to scan trench pattern 86 (in direction 97 along trenches 85 and consecutively along scanning direction 95 perpendicular to trenches 85) sequentially from the first trench to the last trench of each group 87, controller 120 is configured (i) to move respective receiving wafer 70 continuously in a direction 110B against scanning direction 95 of laser scanner optical head 92 and with a speed $v_F$, which transforms source pitch $p_1$ to receiving pitch $p_2$ as disclosed above and (ii) to switch receiving substrates 70 (e.g., by removing previous wafer and providing the consecutive wafer), locate and set the first pre-defined printed line position on receiving substrate 70 opposite to the first trench of next group 87 of trenches 85 on source substrate 80 and commence scanning and transferring paste 82 from consecutive group 87 to consecutive receiving substrate 70. Switching receiving substrates 70 may be carried out, e.g., during the movement of laser scanner optical head 92 over gap 88 thus keeping the scanner head speed substantially constant.

In certain embodiments, dynamic pattern transfer printing system 100 may thus be configured to print conducting lines (fingers) on crystalline silicon PV cells (wafers) in high volume manufacturing, reaching high throughput that may possibly be limited only by the printing equipment itself.

Source substrate 80 (a polymer tape segment) may comprise much more trenches 85 (more densely arranged) than the required number of printed lines on the wafer as receiving substrate 70, and be used to print multiple wafers. For example, if the number of fingers per wafer is 100, the number of trenches 85 on the tape segment may be 1000, with receiving pitch $p_2$ being ten times greater than source pitch $p_1$—it may be possible to print ten wafers (as receiving substrates 70) from one tape segment (as source substrate 80) continuously in one movement of laser scanner optical head 92 along scanning direction 95. When the dynamic printing is operated, it is possible to locate the next wafer exactly at the required position at the beginning of the next filled group 87 of trenches 85 on source substrate 80 to ensure continuous movement of wafers 70 through printing system 100. High throughput printing is enabled by arranging trenches 85 on tape segment 80 at much smaller pitch $p_1$ than the required pitch $p_2$ of fingers printed on wafer 70. For example, a typical pitch $p_2$ of fingers on receiving substrate 70 (e.g., PV wafer) may be within 1-3 mm (e.g., 1.2-1.5 mm, 1.5-2.5 mm, or any other intermediate range) while a typical pitch $p_1$ of trenches 85 on source substrate 80 (e.g., polymer tape) may be about 0.1-0.3 mm (e.g., 0.12-0.15 mm, 0.15-0.2 mm, 0.15-0.25 mm or any other intermediate range). Therefore, in one continuous movement of laser scanner optical head 92 it is possible to print up to ten wafers 70, or possible up to five wafers 70, up to 15 wafers 70, or even up to 20 or 30 wafers 70, or intermediate values, depending on the exact configuration. After all trenches 85 from tape segment 80 are printed, printing system 100 may move another tape segment 80 with trenches 85 filled by paste 82 to the printing station while laser scanner optical head 92 returns to its initial position. At this time of segment replacement and scanner head coming back to its starting position (first trench 85 of first group 87 of trenches on source substrate 80), next wafer 70 may be moved with lower speed to the start position, and when reaching it, the process of continuous printing with high wafer speed and high wafer throughput may continue. Since each wafer 70 is printed with one group 87 of trenches 85 separated with small pitch $p_1$ on tape segment 80, the speed of laser scanner optical head 92 along scanning direction 95 (CMD) is relatively low. For example, if one hundred fingers are printed per wafer 70 during about 0.5 seconds from tape 80 with pitch $p_1$ of 0.15 mm, the speed of scanner head 92 is 30 mm/sec. Such relatively low speed enables very accurate control of positioning laser beam 90 relative to trenches 85.

Certain embodiments comprise pattern transfer sheet 80 used as source substrate 80, which comprise multiple groups of trenches 87 and configured to receive printing paste 82 and release printing paste 82 from trenches 85 upon illumination by laser beam 90 onto receiving substrate 70, wherein pitch $p_1$ of trenches 85 in each group 87 may be constant and groups 87 may be separated by gaps 88, e.g., as illustrated in FIG. 4, with a schematic cross section of pattern transfer sheet 80 illustrated in FIG. 5B.

In various embodiments, pitches $p_1$ in all groups 87 may be equal. In various embodiments, pitches $p_1$ may be between 0.1-0.2 mm.

In various embodiments, gaps 88 between all consecutive groups 87 may be equal. Pattern transfer sheet 80 may be configured to have gaps 88 correspond to scanning speed $v_S$ of pattern transfer sheet 80 by laser scanner optical head 92 (e.g., in printing system 100) multiplied by the duration required to switch and position receiving substrate 70 between consecutive pattern transfers, as explained herein.

For example, gaps 88 may be between 1-10 mm, e.g., up to 2 mm, up to 3 mm, up to 5 mm or up to 10 mm.

In various embodiments, printing system 100 may be configured, e.g., through the control of movements 110, to increase the accuracy of paste deposition 93 from trenches 85, e.g., to improve the accuracy of produced PV cells. For example, printing system 100 may be configured, e.g., through the control of movements 110, to increase the accuracy of selective emitter pre-alignment, e.g., by increasing the accuracy of paste deposition on PV selective emitter lines.

FIG. 5A is a high-level block diagram of exemplary controllers 120, which may be used with embodiments of the present invention. Controller(s) 120 may include one or more controller or processor 123 that may be or include, for example, one or more central processing unit processor(s) (CPU), one or more Graphics Processing Unit(s) (GPU or general-purpose GPU—GPGPU), a chip or any suitable computing or computational device, an operating system 121, a memory 122, a storage 125, input devices 126 and output devices 127.

Operating system 121 may be or may include any code segment designed and/or configured to perform tasks involving coordination, scheduling, arbitration, supervising, controlling, or otherwise managing operation of controller(s) 120, for example, scheduling execution of programs. Memory 122 may be or may include, for example, a Random-Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short-term memory unit, a long-term memory unit, or other suitable memory units or storage units. Memory 122 may be or may include a plurality of possibly different memory units. Memory 122 may store for example, instructions to carry out a method (e.g., code 124), and/or data such as user responses, interruptions, etc.

Executable code 124 may be any executable code, e.g., an application, a program, a process, task or script. Executable code 124 may be executed by controller 123 possibly under control of operating system 121. For example, executable code 124 may when executed cause the production or compilation of computer code, or application execution such as VR execution or inference, according to embodiments of the present invention. Executable code 124 may be code produced by methods described herein. For the various modules and functions described herein, one or more computing devices and/or components of controller(s) 120 may be used. Devices that include components similar or different to those included in controller(s) 120 may be used and may be connected to a network and used as a system. One or more processor(s) 123 may be configured to carry out embodiments of the present invention by for example executing software or code.

Storage 125 may be or may include, for example, a hard disk drive, a floppy disk drive, a Compact Disk (CD) drive, a CD-Recordable (CD-R) drive, a universal serial bus (USB) device or other suitable removable and/or fixed storage unit. Data such as instructions, code, VR model data, parameters, etc. may be stored in a storage 125 and may be loaded from storage 125 into a memory 122 where it may be processed by controller 123. In some embodiments, some of the components shown in FIG. 7 may be omitted.

Input devices 126 may be or may include for example a mouse, a keyboard, a touch screen or pad or any suitable input device. It will be recognized that any suitable number of input devices may be operatively connected to controller(s) 120 as shown by block 126. Output devices 127 may include one or more displays, speakers and/or any other suitable output devices. It will be recognized that any suitable number of output devices may be operatively connected to controller(s) 120 as shown by block 127. Any applicable input/output (I/O) devices may be connected to controller(s) 120, for example, a wired or wireless network interface card (NIC), a modem, printer or facsimile machine, a universal serial bus (USB) device or external hard drive may be included in input devices 126 and/or output devices 127.

Embodiments of the invention may include one or more article(s) (e.g., memory 122 or storage 125) such as a computer or processor non-transitory readable medium, or a computer or processor non-transitory storage medium, such as for example a memory, a disk drive, or a USB flash memory, encoding, including or storing instructions, e.g., computer-executable instructions, which, when executed by a processor or controller, carry out methods disclosed herein.

Figure 6:
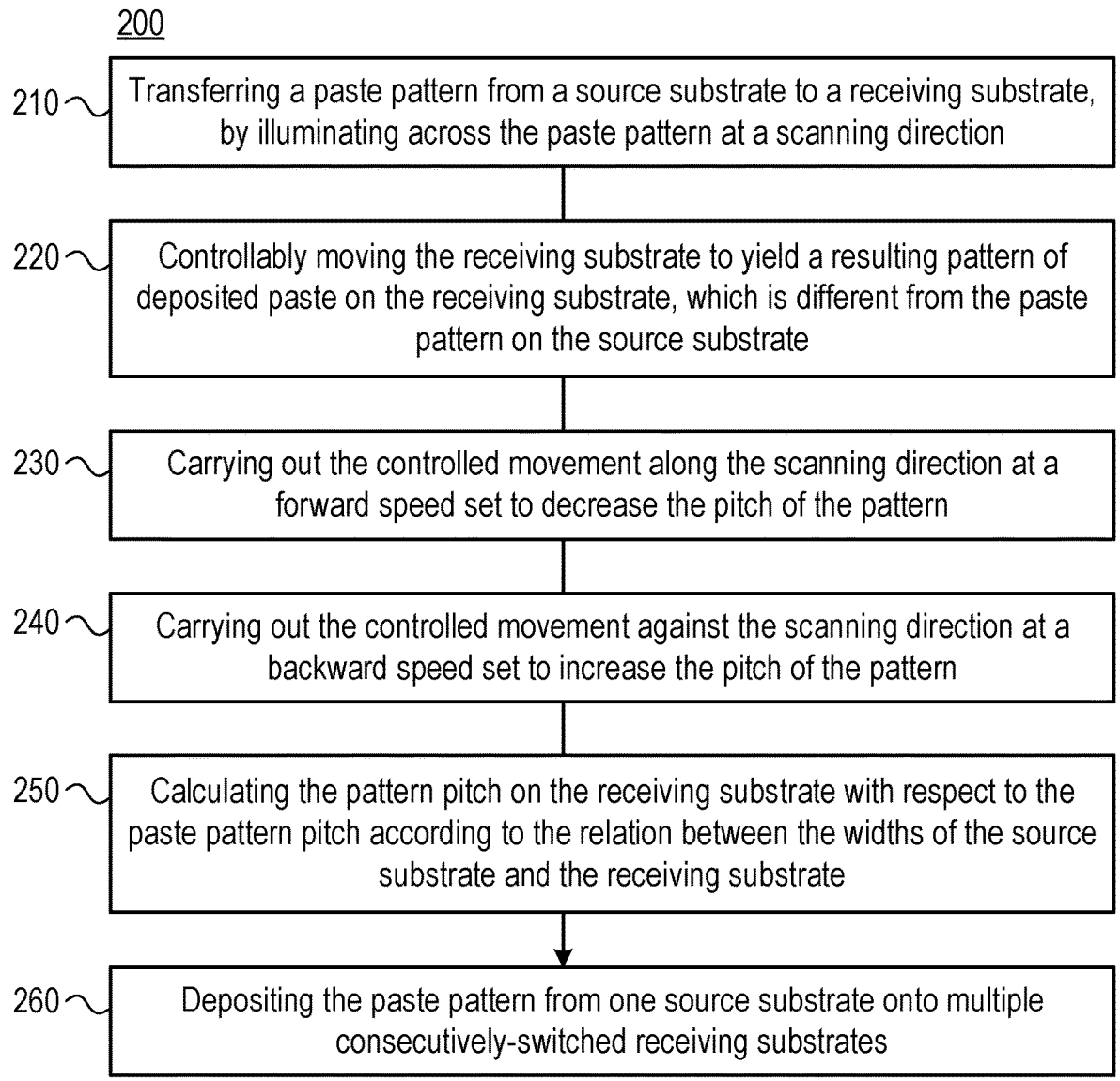
FIG. 6 is a high-level flowchart illustrating dynamic pattern transfer printing methods, according to some embodiments of the invention.

FIG. 6 is a high-level flowchart illustrating a dynamic pattern transfer printing method 200, according to some embodiments of the invention. The method stages may be carried out with respect to system 100 described above, which may optionally be configured to implement method 200. Method 200 may be at least partially implemented by at least one computer processor, e.g., in controller 120. Certain embodiments comprise computer program products comprising a computer readable storage medium having computer readable program embodied therewith and configured to carry out the relevant stages of method 200. Method 200 may comprise the following stages, irrespective of their order.

Dynamic pattern transfer printing method 200 may comprise transferring a paste pattern from a source substrate to a receiving substrate, by illuminating across the paste pattern at a scanning direction (stage 210). The illuminated source substrate comprises a plurality of trenches arranged in a first pattern and holding printing paste and is configured to release the printing paste from the trenches and onto a receiving substrate upon the illumination by a laser beam, which is carried out along the trenches, and at a scanning direction across the trenches. Method 200 may further comprise controllably moving the receiving substrate to yield a second pattern of deposited paste on the receiving substrate, which is different from the first pattern of trenches on the source substrate (stage 220).

In some embodiments, the first pattern of trenches on the source substrate may have a first pitch and the second pattern of deposited paste on the receiving substrate may have a second pitch. When the first pitch is larger than the second pitch, the controlled movement may be carried out along the scanning direction at a forward speed set to decrease the pitch of the pattern (stage 230), while when the first pitch is smaller than the second pitch, the controlled movement may be carried out against (in a contrary direction to) the scanning direction at a backward speed set to increase the pitch of the pattern (stage 240). Method 200 may further comprise calculating the pattern pitch on the receiving substrate with respect to the paste pattern pitch according to the relation between the widths of the source substrate and the receiving substrate (stage 250) and control the pattern transfer process accordingly.

In certain embodiments, the first pattern of trenches on the source substrate may comprise a plurality of groups of the trenches, and method 200 may further comprise depositing paste from one source substrate onto a plurality of receiving substrates by depositing the paste from the trenches of each group onto one of the receiving substrates, and switching the receiving substrate between consecutive groups of the trenches (stage 260). The receiving substrates (e.g., wafers) may be consecutively-switched to enable continues pattern transfer onto them from the single source substrate (per group of wafers).

Elements from FIGS. 1A-6 may be combined in any operable combination, and the illustration of certain elements in certain figures and not in others merely serves an explanatory purpose and is non-limiting.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A dynamic pattern transfer printing system comprising:
at least one laser scanner configured to illuminate with at least one laser beam a source substrate that comprises a plurality of trenches arranged in a first pattern and holding printing paste, wherein the source substrate is configured to release the printing paste from the trenches and onto a receiving substrate upon the illumination by the laser beam,
a moveable stage supporting the receiving substrate, wherein the receiving substrate is affixed to the moveable stage during the releasing of the printing paste from the source substrate, and
a controller configured to control the laser beam illumination along the trenches, and at a scanning direction across the trenches, and further configured to move the moveable stage to yield a second pattern of deposited paste on the receiving substrate, which is different from the first pattern of trenches on the source substrate,
wherein the first pattern of trenches on the source substrate has a first pitch and the second pattern of deposited paste on the receiving substrate has a second pitch, and
wherein the controller is configured to move the moveable stage in at least one of:
along the scanning direction, to yield the second pattern on the receiving substrate, wherein the first pitch ($p_1$), the second pitch ($p_2$), a forward speed of the moveable stage ($v_F$) and a scanner speed across the trenches ($v_S$) are configured to have the relation $p_2 = p_1 \cdot (v_S - v_F)/v_S$ to make the second pitch smaller than the first pitch ($p_2 < p_1$); and/or against the scanning direction, to yield the second pattern on the receiving substrate, wherein the first pitch ($p_1$), the second pitch ($p_2$), a backward speed of the moveable stage ($v_B$) and a scanner speed across the trenches ($v_S$) are configured to have the relation $p_2 = p_1 \cdot (v_S + v_B)/v_S$ to make the second pitch larger than the first pitch ($p_2 > p_1$).

2. A dynamic pattern transfer printing system comprising:
at least one laser scanner configured to illuminate with at least one laser beam a source substrate that comprises a plurality of trenches arranged in a first pattern and holding printing paste, wherein the source substrate is configured to release the printing paste from the trenches and onto a receiving substrate upon the illumination by the laser beam,
a moveable stage supporting the receiving substrate, wherein the receiving substrate is affixed to the moveable stage during the releasing of the printing paste from the source substrate, and
a controller configured to control the laser beam illumination along the trenches, and at a scanning direction across the trenches, and further configured to move the moveable stage to yield a second pattern of deposited paste on the receiving substrate, which is different from the first pattern of trenches on the source substrate,
wherein the first pattern of trenches on the source substrate has a first pitch and the second pattern of deposited paste on the receiving substrate has a second pitch, and
wherein the controller is further configured to calculate the second pitch with respect to the first pitch, according to a relation between widths of the source substrate and the receiving substrate.

3. The dynamic pattern transfer printing system of claim 2, wherein the first pitch is smaller than the second pitch and the controller is configured to move the moveable stage against the scanning direction at a backward speed set to convert the first pitch to the second pitch, and further configured to deposit paste from one source substrate onto a plurality of receiving substrates, wherein:
the first pattern of trenches on the source substrate comprises a plurality of groups of the trenches, and
the controller is further configured to deposit the paste from the trenches of each group onto one of the receiving substrates, and to switch the receiving substrate between consecutive groups of the trenches.

4. A dynamic pattern transfer printing method comprising:
illuminating a source substrate with at least one laser beam, wherein:
the source substrate comprises a plurality of trenches arranged in a first pattern and holding printing paste,
the source substrate is configured to release the printing paste from the trenches and onto a receiving substrate upon the illumination by the laser beam, and
the illuminating is carried out along the trenches, and at a scanning direction across the trenches; and
controllably moving the receiving substrate to yield a second pattern of deposited paste on the receiving substrate, which is different from the first pattern of trenches on the source substrate,
wherein the first pattern of trenches on the source substrate has a first pitch and the second pattern of deposited paste on the receiving substrate has a second pitch,
and wherein the dynamic pattern transfer printing method further comprises at least one of:
moving the moveable stage in the scanning direction to yield the second pattern on the receiving substrate, and configuring the first pitch ($p_1$), the second pitch ($p_2$), a forward speed of the moveable stage ($v_F$) and a scanner speed across the trenches ($v_S$) to have the relation $p_2 = p_1 \cdot (v_S - v_F)/v_S$ to make the second pitch smaller than the first pitch ($p_2 < p_1$); and/or
moving the moveable stage against the scanning direction to yield the second pattern on the receiving substrate, and configuring the first pitch ($p_1$), the second pitch ($p_2$), a backward speed of the moveable stage ($v_B$) and a scanner speed across the trenches ($v_S$) to have the relation $p_2 = p_1 \cdot (v_S + v_B)/v_S$ to make the second pitch larger than the first pitch ($p_2 > p_1$).

5. The dynamic pattern transfer printing method of claim 4, wherein the first pitch is larger than the second pitch ($p_2 < p_1$) and the controlled movement is carried out along the scanning direction at a forward speed set to convert the first pitch to the second pitch.

6. The dynamic pattern transfer printing method of claim 4, wherein the first pitch is smaller than the second pitch ($p_2 > p_1$) and the controlled movement is carried out against the scanning direction at a backward speed set to convert the first pitch to the second pitch.

7. The dynamic pattern transfer printing method of claim 4, further comprising calculating the second pitch with respect to the first pitch, according to a relation between widths of the source substrate and the receiving substrate.

8. The dynamic pattern transfer printing method of claim 6, wherein the first pattern of trenches on the source substrate comprises a plurality of groups of the trenches, and the method further comprises:
depositing paste from one source substrate onto a plurality of receiving substrates by depositing the paste from the trenches of each group onto one of the receiving substrates, and switching the receiving substrate between consecutive groups of the trenches.

9. The dynamic pattern transfer printing method of claim 4, carried out at least partly by at least one computer processor.

10. A computer program product comprising a non-transitory computer readable storage medium having computer readable program embodied therewith, the computer readable program configured to carry out the dynamic pattern transfer printing method of claim 4, at least partly.

11. A pattern transfer sheet comprising:
a plurality of groups of trenches and configured to receive printing paste and release the printing paste from the trenches upon illumination by a laser beam onto a receiving substrate,
wherein a pitch of the trenches in each group is constant and the groups are separated by gaps, and
wherein the pitches in all groups are equal and are between 0.1-0.3 mm and wherein the gaps between all consecutive groups are equal and are between 1-10 mm, and the gaps correspond to a scanning speed of the pattern transfer sheet by a laser scanner optical head multiplied by a duration required to switch and position the receiving substrate between consecutive pattern transfers.

* * * * *